United States Patent [19]
Okada et al.

[11] Patent Number: 5,923,228
[45] Date of Patent: Jul. 13, 1999

[54] MAGNETOSTATIC WAVE DISTRIBUTOR, SYNTHESIZER AND S/N ENHANCER

[75] Inventors: Takekazu Okada, Ishikawa-ken; Satoru Shinmura; Fumio Kanaya, both of Nagaokakyo; Akira Toba, Shiga-ken; Toshihiro Nomoto, Tokyo-to, all of Japan

[73] Assignee: Murata Manufacturing Co., Ltd., Japan

[21] Appl. No.: 08/812,691

[22] Filed: Mar. 6, 1997

[30]     Foreign Application Priority Data

Mar. 8, 1996  [JP]  Japan ..................................... 8-080909

[51] Int. Cl.⁶ ....................................................... H04B 3/03
[52] U.S. Cl. ......................... 333/109; 333/117; 333/24 R
[58] Field of Search ..................................... 333/109, 117, 333/24 R, 24.1

[56]                References Cited

U.S. PATENT DOCUMENTS 4,314,214   2/1982   Castera et al. ........................... 333/141
5,319,325   6/1994   Konishi ............................... 333/109 X

FOREIGN PATENT DOCUMENTS 022700     1/1981   European Pat. Off. .
4204299    8/1993   Germany .
4-160735   6/1992   Japan ..................................... 333/24.1

*Primary Examiner*—Robert Pascal
*Assistant Examiner*—Justin P. Bettendorf
*Attorney, Agent, or Firm*—Ostrolenk, Faber, Gerb & Sofeen, LLP

[57]                ABSTRACT

An S/N enhancer is provided which can be formed to be small in size and in which impedance matching can easily be achieved. The S/N enhancer includes two magnetostatic wave elements. First to fourth transducers each in the shape of a single line are disposed on YIG thin films of the magnetostatic wave elements in parallel and spaced from one another. An input terminal is connected to one end of the first transducer. An attenuator is connected between the other end of the first transducer and one end of the third transducer. A 180° shifter and another attenuator are connected in series between one end of the second transducer and one end of the fourth transducer. An output terminal is connected to the other end of the fourth transducer. The other ends of the second and third transducers are respectively grounded.

17 Claims, 5 Drawing Sheets

MAGNETOSTATIC WAVE DISTRIBUTOR, SYNTHESIZER AND S/N ENHANCER

BACKGROUND OF THE INVENTION

1. Field of the Invention

The present invention relates to a distributor, a synthesizer and an S/N enhancer. More particularly, the present invention relates to an S/N enhancer for improving the signal to noise (S/N) ratio of a main signal contained in an input signal, for example, and relates further to a distributor and a synthesizer for use in such an S/N enhancer.

2. Description of the Related Art

An example of a conventional S/N enhancer is disclosed in Japanese Unexamined Patent Publication No. 4-123502. FIG. 9 is a schematic view illustrating an example of such a conventional S/N enhancer. An S/N enhancer 1 shown in FIG. 9 comprises an input terminal 2 which is connected to the input end of a directional coupler 3. This directional coupler 3 is used to divide a signal input to the input terminal 2 so as to output a high-level signal of the same level as that of the input signal and a low-level signal attenuated by, for example, approximately 30 dB. The respective components of the input signal, the high-level output signal and the low-level output signal will be discussed below in more detail.

The two output terminals of the directional coupler 3 are respectively connected to the input terminals of two magnetostatic wave filters 4a and 4b utilizing a surface magnetostatic wave mode. The magnetostatic wave filters 4a and 4b have a YIG (yttrium iron garnet) thin film formed as a ferromagnetic substrate on one of the main surfaces of a GGG (gadolinium gallium garnet) substrate, an input-side transducer and an output-side transducer in the shape of single lines, which are arranged in parallel spaced from each other on the YIG thin film, and a DC magnetic-field applied to the YIG thin film in a direction parallel to the direction in which these transducers extend.

The magnetostatic wave filters 4a and 4b have a frequency-selective non-linear amplitude limitation characteristic which is the same for both filters. This frequency-selective non-linear amplitude limitation characteristic will be explained based on the following example.

Now, a signal of a frequency $f_1$ and a signal of a frequency $f_2$ are inputted into a filter at the same time.

1) If both signals do not exceed a saturation level, then both are outputted from the filter without amplitude limitation.

2) If the signal of frequency $f_1$ does not exceed the saturation level and the signal of frequency $f_2$ exceeds the saturation level, then the signal of frequency $f_1$ is outputted from the filter without amplitude limitation, and on the other hand, the signal of frequency $f_2$ receives amplitude limitation before it is outputted from the filter.

3) If the signal of frequency $f_1$ exceeds the saturation level and the signal of frequency $f_2$ does not exceed the saturation level, then the signal of frequency $f_1$ receives amplitude limitation before it is outputted from the filter, and on the other hand, the signal of frequency $f_2$ is outputted from the filter without amplitude limitation.

4) If both signals exceed the saturation level, then both are outputted from the filter after receiving amplitude limitation.

The magnetostatic wave filter 4a is used as a limiter for limiting the amplitude of a high-level main signal which is contained in the high-level signal output from the directional coupler 3. The other magnetostatic wave filter 4b is used to allow the low-level signal output from the directional coupler 3 to pass.

The output end of the magnetostatic wave filter 4b is connected to the input end of a 180° shifter 5. This 180° shifter 5 is used to invert the phase of a signal output from the magnetostatic wave filter 4b. Further, the output end of the magnetostatic wave filter 4a and the output end of the 180° shifter 5 are respectively connected to the two input ends of a directional coupler 6. This directional coupler 6 is used to attenuate the level of the signal output from the magnetostatic wave filter 4a and synthesize that signal with the signal output from the 180° shifter 5. Further, the output end of the directional coupler 6 is connected to an output terminal 7.

Therefore, in the S/N enhancer 1, in the section between the input terminal 2 and the output terminal 7, the directional coupler 3, the magnetostatic wave filter 4a and the directional coupler 6 constitute a first signal path, and the directional coupler 3, the magnetostatic wave filter 4b, the 180° shifter 5 and the directional coupler 6 constitute a second signal path.

In this S/N enhancer 1, an input signal containing a high-level main signal, and low-level noise whose frequency is different from the main signal, is input to the input terminal 2, and is divided by the directional coupler 3 into a high-level signal at nearly the same level as that of the input signal and a low-level signal which is attenuated by, for example, approximately 30 dB. In this case, the high-level signal contains a high-level main signal and low-level noise whose frequencies differ from each other, and the low-level signal contains a low-level main signal and still-lower-level noise whose frequencies differ from each other.

In the magnetostatic wave filter 4a, the main signal in the high-level signal receives amplitude limitation because its level is high; however, the noise in the high-level signal does not receive amplitude limitation because its frequency differs from the frequency of the main signal and because its level is low. In contrast to this, in the other magnetostatic wave filter 4b, since the levels of both the main signal and the noise in the low-level signal are low, they do not receive amplitude limitation. (However, the levels of both the high-level signal and the low-level signal are slightly attenuated due to insertion loss in the magnetostatic wave filters 4a and 4b.)

The phase of the signal output from the magnetostatic wave filter 4b is inverted by the 180° shifter 5. The level of the signal output from the magnetostatic wave filter 4a is then attenuated by the directional coupler 6, and that level-attenuated signal and the signal output from the 180° shifter 5 are synthesized. In this case, the phase of the signal output from the magnetostatic wave filter 4b is inverted so that the phases of the noise in the two signals synthesized by the directional coupler 6 become opposite to each other. Therefore, the noise which passes through the first signal path including the magnetostatic wave filter 4a and the noise which passes through the second signal path including the magnetostatic wave filter 4b cancel each other. Further, the main signal which passes through the first signal path receives amplitude limitation by the magnetostatic wave filter 4a, whereas the main signal which passes through the second signal path does not receive amplitude limitation by the magnetostatic wave filter 4b. Therefore, the value of the main signal level which passes through the first signal path is reduced by the value of the main signal level which passes through the second signal path, and the resultant value of the main signal is obtained at the output end of the directional coupler 6 or the output terminal 7. Therefore, in the S/N enhancer 1, S/N of the input signal is improved.

FIG. 10 is a schematic view illustrating another example of a conventional S/N enhancer. In the S/N enhancer shown in FIG. 10, as compared with the S/N enhancer shown in FIG. 9, the directional coupler 3 and directional coupler 6 are not used. Instead, the input terminal 2 is directly connected to the input end of the magnetostatic wave filter 4a and connected to the input end of the magnetostatic wave filter 4b via an attenuator 8 formed of two resistors, and the output end of the magnetostatic wave filter 4a is connected to the output terminal 7 via an attenuator 9 formed of two resistors, and the output end of the 180° shifter 5 is directly connected to the output terminal 7.

In the S/N enhancer shown in FIG. 10, the magnetostatic wave filters 4a and 4b operate in the same way as the S/N enhancer shown in FIG. 9, whereby the S/N ratio of an input signal is improved.

In the S/N enhancer shown in FIG. 9, since the directional couplers 3 and 6 are used to distribute or synthesize a signal, it is difficult to achieve a small size. On the other hand, in the S/N enhancer shown in FIG. 10, since the directional couplers are not used and the attenuators 8 and 9 formed of resistors are used instead, it is easy to achieve a small size. However, since the attenuators 8 and 9 are directly connected to the input terminal 2 and the output terminal 7, respectively, achievement of impedance matching between the input terminal 2 and an external circuit and between the output terminal 7 and an external circuit is difficult, so that an undesired signal due to a magnetostatic wave reflected to the output-side transducers in the magnetostatic wave filters 4a and 4b may pass through the attenuator 8, possibly causing a ripple to occur in the output signal.

SUMMARY OF THE INVENTION

Accordingly, a primary advantage of the present invention is that it can provide a distributor which makes it easy to form a small sized S/N enhancer in which impedance matching cain easily be achieved.

Another advantage of the present invention is that it can provide a synthesizer which makes it easy to form a small sized S/N enhancer and in which impedance matching can easily be achieved.

Still another advantage of the present invention is that it can provide a small sized S/N enhancer in which impedance matching can easily be achieved.

To achieve the above-described advantages, according to one aspect of the present invention, there is provided a distributor, comprising: a ferromagnetic substrate adapted to receive a magnetic field; an input-side transducer disposed on the ferromagnetic substrate; an output-side transducer disposed in parallel to the input-side transducer on the ferromagnetic substrate; an input terminal connected to one end of the input-side transducer; a first output terminal connected to the other end of the input-side transducer; and a second output terminal connected to one end of the output-side transducer, wherein the other end of the output-side transducer is grounded.

In the distributor in accordance with the first aspect of the present invention, it is preferable for reasons to be described later that an attenuator or a nonreciprocal circuit element be connected between the input-side transducer and the first output terminal.

According to another aspect of the present invention, there is provided a synthesizer, comprising: a ferromagnetic substrate adapted to receive a magnetic field; an input-side transducer disposed on the ferromagnetic substrate; an output-side transducer disposed in parallel to the input-side transducer on the ferromagnetic substrate; a first input terminal connected to one end of the input-side transducer; a second input terminal connected to one end of the output-side transducer; and an output terminal connected to the other end of the output-side transducer, wherein the other end of the input-side transducer is grounded.

In the synthesizer in accordance with the second aspect of the present invention, it is preferable for reasons to be described later that an attenuator or a nonreciprocal circuit element be connected between the second input terminal and the output-side transducer.

An S/N enhancer in accordance with a third aspect of the present invention comprises the above-described distributor or synthesizer, or both.

According to the third aspect of the present invention, there is provided an S/N enhancer, comprising: a first ferromagnetic substrate adapted to receive a magnetic field; a first input-side transducer disposed on the first ferromagnetic substrate; a first output-side transducer disposed in parallel to the first input-side transducer on the first ferromagnetic substrate; a second ferromagnetic substrate adapted to receive a magnetic field; a second input-side transducer disposed on the second ferromagnetic substrate; a second output-side transducer disposed in parallel to the second input-side transducer on the second ferromagnetic substrate; an input terminal connected to one end of the first input-side transducer; a first attenuator, connected between the other end of the first input-side transducer and one end of the second input-side transducer, for attenuating signals which pass through the first input-side transducer; a second attenuator, connected between one end of the first output-side transducer and one end of the second output-side transducer, for attenuating signals which are obtained from the first output-side transducer; and an output terminal connected to the other end of the second output-side transducer, wherein the other end of the first output-side transducer is grounded, the other end of the second input-side transducer is grounded, such that noise which passes through the first attenuator and noise which passes through the second attenuator are adjusted to have respective phases such that they cancel each other before reaching the output.

In the S/N enhancer in accordance with the present invention, the phase difference of the noise signals may be adjusted by a 180° shifter provided in the stage anterior to or posterior to the first or second attenuator.

In the S/N enhancer in accordance with the present invention, the phase difference of the noise signals may be adjusted by disposing the end of the first input-side transducer connected to the first attenuator, and the end of the first output-side transducer connected to the second attenuator, on opposite sides and respective ends of the first ferromagnetic substrate; and by disposing the end of the second input-side transducer connected to the first attenuator, and the end of the second output-side transducer connected to the second attenuator, on the same side of the second ferromagnetic substrate.

In the S/N enhancer in accordance with the present invention, the phase difference of the noise signals may be adjusted by disposing the end of the first input-side transducer connected to the first attenuator, and the end of the first output-side transducer connected to the second attenuator, at respective ends and on opposite sides of the first ferromagnetic substrate; and by disposing the end of the second input-side transducer connected to the first attenuator, and the end of the second output-side transducer connected to the second attenuator, at respective ends and on opposite sides of the second ferromagnetic substrate.

Thus, according to the present invention, an S/N enhancer can be obtained which can easily be formed to be small in size and in which impedance matching can easily be achieved.

In the S/N enhancer in accordance with the present invention, if the phase difference of noise signals is adjusted by the arrangement of the end portions of transducers instead of by using a 180° shifter, the S/N enhancer can easily be formed to an even smaller size.

The above and further objects, aspects and novel features of the invention will more fully appear from the following detailed description when read in connection with the accompanying drawings.

DESCRIPTION OF EMBODIMENTS OF THE INVENTION

Figure 1:
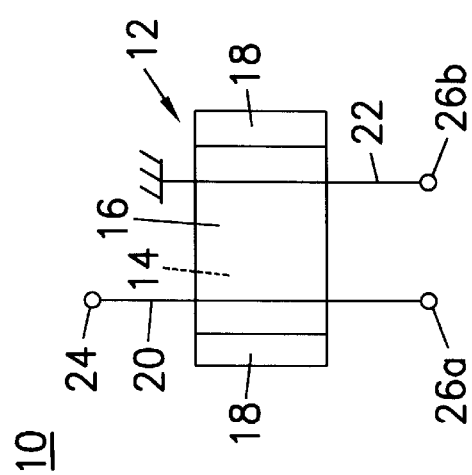
FIG. 1 is a schematic view illustrating an example of a distributor according to an embodiment of the present invention.

FIG. 1 is a schematic view illustrating an example of a distributor according to an embodiment of the present invention. A distributor 10 comprises a magnetostatic wave element 12. The magnetostatic wave element 12 comprises a GGG (gadolinium gallium garnet) substrate 14, for example, in the shape of a strip. A YIG (yttrium iron garnet) thin film 16 is formed as a ferromagnetic substrate on one of the main surfaces of the GGG substrate 14. A magnetostatic wave absorbing material 18 for absorbing undesired magnetostatic waves which are generated in the YIG thin film 16 are respectively formed extending across both of the end portions of the surface of the YIG thin film 16.

An input-side transducer 20 and an output-side transducer 22, in the shape of a single line, for example, are disposed in parallel spaced from each other on the YIG thin film 16 of the magnetostatic wave element 12. In this case, the input-side transducer 20 and the output-side transducer 22 are disposed in such a manner as to cross one end and the other end of the YIG thin film 16 along the width thereof.

An input terminal 24 is connected to one end of the input-side transducer 20. A first output terminal 26a is connected to the other end of the input-side transducer 20. A second output terminal 26b is connected to one end of the output-side transducer 22. The other end of the output-side transducer 22 is grounded.

Further, a DC magnetic-field source (not shown) is provided for applying a DC magnetic field to the YIG thin film 16 in parallel to the direction in which the input-side transducer 20 and the output-side transducer 22 extend.

In this distributor 10, when a signal containing a main signal is input to the input terminal 24, the input signal passes through the input-side transducer 20 and is output from the first output terminal 26a. Further, the main signal in the input signal is converted into a surface magnetostatic wave. This surface magnetostatic wave is propagated from the input-side transducer 20 to the output-side transducer 22. The surface magnetostatic wave is then converted into a main signal by the output-side transducer 22, and the main signal is output from the second output terminal 26b. Therefore, in an S/N enhancer, this distributor 10 can be used for dividing the input signal containing the main signal into two signals, converting the main signal in one of the divided signals into a magnetostatic wave, and converting the magnetostatic wave into a main signal. In this case, since a directional coupler is not used in the distributor 10, the S/N enhancer can easily be formed to be small in size.

Also, in the distributor 10, impedance matching is easily achieved since the input terminal and the output terminal are not connected to circuits with branches, the input terminal 24 is connected to one end of the input-side transducer 20, the first output terminal 26a is connected to the other end of the input-side transducer 20, and the second output terminal 26b is connected to one end of the output-side transducer 22.

Figure 2:
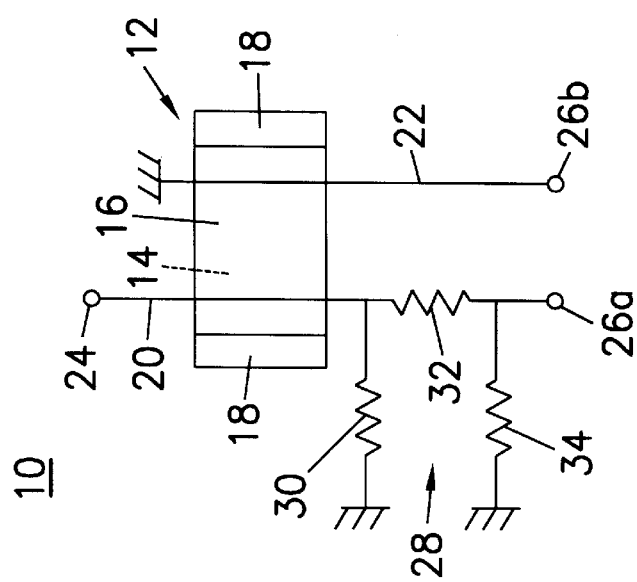
FIG. 2 is a schematic view illustrating another example of a distributor according to an embodiment of the present invention.

FIG. 2 is a schematic view illustrating another example of a distributor according to an embodiment of the present invention. In the distributor shown in FIG. 2, as compared with the distributor shown in FIG. 1, an attenuator 28 is connected between the input-side transducer 20 and the first output terminal 26a. This attenuator 28 is formed of three resistors 30, 32 and 34 which are connected, for example, in the shape of π.

In the distributor shown in FIG. 2, since components other than the attenuator 28 operate in the same way as in the distributor shown in FIG. 1, the S/N enhancer can be formed to be small in size and impedance matching can easily be achieved.

Also, in the distributor 10 shown in FIG. 2, since the attenuator 28 is connected between the input-side transducer 20 and the first output terminal 26a, isolation between the input-side transducer 20 and the first output terminal 26a is improved.

Figure 3:
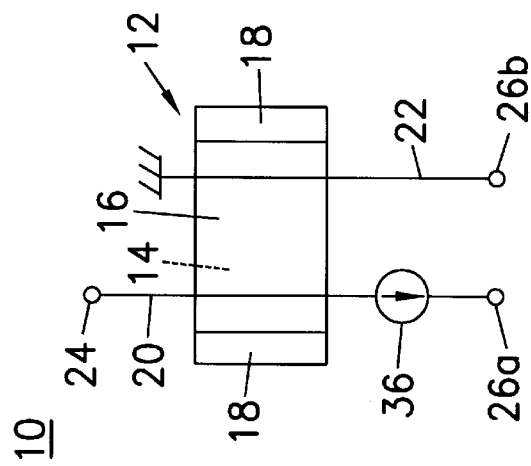
FIG. 3 is a schematic view illustrating still another example of a distributor according to an embodiment of the present invention.

FIG. 3 is a schematic view illustrating still another example of a distributor according to an embodiment of the present invention. In the distributor shown in FIG. 3, as compared with the distributor shown in FIG. 1, an isolator 36 such as a nonreciprocal circuit element is connected between the input-side transducer 20 and the first output terminal 26a. In this case, the isolator 36 is connected in such a way that the signal passes from the input-side transducer 20 to the first output terminal 26a.

In the distributor shown in FIG. 3, since components other than the isolator 36 operate in the same way as in the distributor shown in FIG. 1, the S/N enhancer can be formed to be small in size and impedance matching can easily be achieved.

Also, in the distributor 10 shown in FIG. 3, since the isolator 36 is connected between the input-side transducer 20 and the first output terminal 26a, isolation and directivity between the input-side transducer 20 and the first output terminal 26a are improved.

Figures 4, 5, 6:
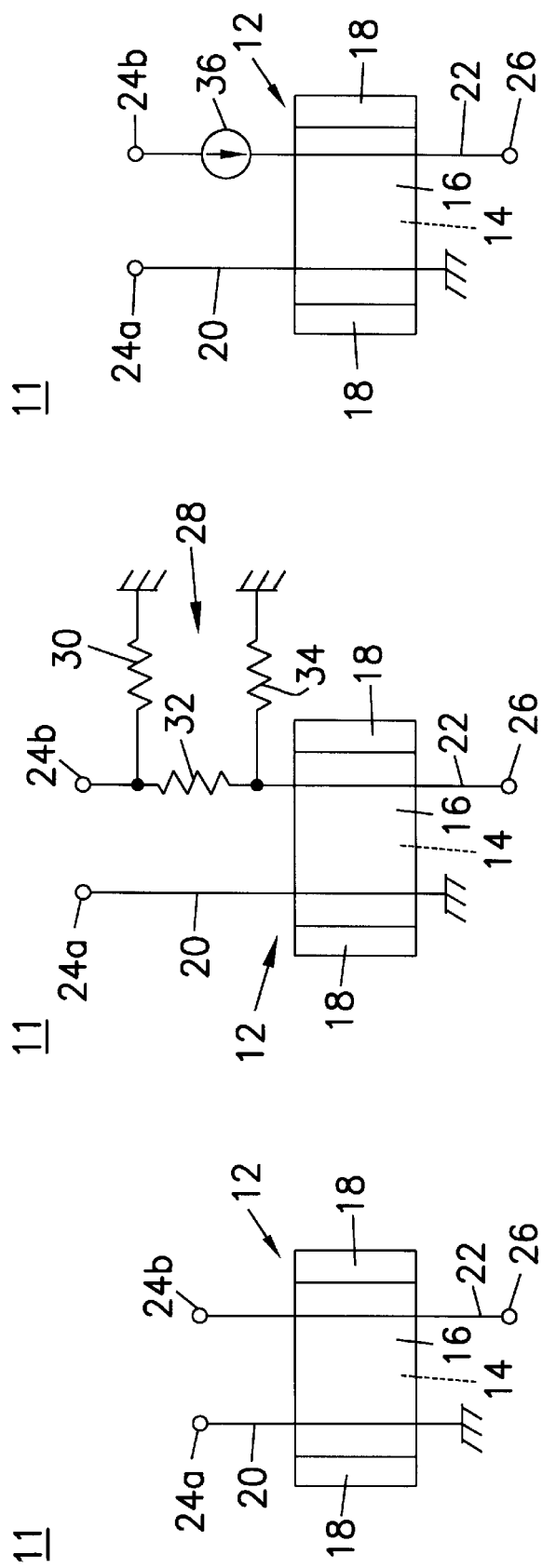
FIG. 4 is a schematic view illustrating an example of a synthesizer according to an embodiment of the present invention.
FIG. 5 is a schematic view illustrating another example of a synthesizer according to an embodiment of the present invention.
FIG. 6 is a schematic view illustrating still another example of a synthesizer according to an embodiment of the present invention.

FIG. 4 is a schematic view illustrating an example of a synthesizer according to an embodiment of the present invention. A synthesizer 11, in the same manner as the distributor 10 shown in FIGS. 1 to 3, comprises a magnetostatic wave element 12, an input-side transducer 20 and an output-side transducer 22. The magnetostatic wave element 12 comprises a GGG substrate 14, for example, in the shape of a strip. A YIG thin film 16 is formed on one of the main surfaces of the GGG substrate 14, and magnetostatic wave absorbing materials 18 for absorbing undesired magnetostatic waves which are generated in the YIG thin film 16 are respectively formed extending across both of the end portions of the surface of the YIG thin film 16. Further, a DC magnetic-field source (not shown) is provided for applying a DC magnetic field to the YIG thin film 16 in parallel to a direction in which the input-side transducer 20 and the output-side transducer 22 extend.

Furthermore, in the synthesizer 11, a first input terminal 24a is connected to one end of the input-side transducer 20, and the other end of the input-side transducer 20 is grounded. A second input terminal 24b is connected to one end of the output-side transducer 22, and an output terminal 26 is connected to the other end of the output-side transducer 22.

In this synthesizer 11, when a signal containing a main signal is input to the first input terminal 24a, the main signal in the input signal is converted into a surface magnetostatic wave. This surface magnetostatic wave is propagated from the input-side transducer 20 to the output-side transducer 22. The surface magnetostatic wave is then converted into a main signal by the output-side transducer 22, and the main signal is output from the output terminal 26. Further, when a signal is input to the second input terminal 24b, the input signal is output from the output terminal 26 after passing through the output-side transducer 22. Therefore, this synthesizer 11 can be used in the S/N enhancer as a means for converting the main signal in the input signal into a magnetostatic wave, converting the magnetostatic wave into a main signal and synthesizing the main signal and another input signal. In this case, since a directional coupler is not used in the synthesizer 11, the S/N enhancer can easily be formed to be small in size.

Further, in the synthesizer 11, the input terminal and the output terminal are not connected to circuits with branches, the first input terminal 24a is connected to one end of the input-side transducer 20, the second input terminal 24b is connected to one end of the output-side transducer 22, and the output terminal 26 is connected to the other end of the output-side transducer 22; thus, impedance matching can easily be achieved.

FIG. 5 is a schematic view illustrating another example of a synthesizer according to an embodiment of the present invention. In the synthesizer shown in FIG. 5, as compared with the synthesizer shown in FIG. 4, an attenuator 28 is connected between the second input terminal 24b and the output-side transducer 22. This attenuator 28 is formed of three resistors 30, 32 and 34 which are connected, for example, in the shape of π.

In the synthesizer shown in FIG. 5, since components other than the attenuator 28 operate in the same way as in the synthesizer shown in FIG. 4, the S/N enhancer can be formed to be small in size and impedance matching can easily be achieved.

Further, in the synthesizer 11 shown in FIG. 5, since the attenuator 28 is connected between the second input terminal 24b and the output-side transducer 22, isolation between the second input terminal 24b and the output-side transducer 22 is improved.

FIG. 6 is a schematic view illustrating still another example of a synthesizer according to an embodiment of the present invention. In the synthesizer shown in FIG. 6, as compared with the synthesizer shown in FIG. 4, an isolator 36 such as a nonreciprocal circuit element is connected between the second input terminal 24b and the output-side transducer 22. In this case, the isolator 36 is connected in such a way that the signal passes from the second input terminal 24b to the output-side transducer 22.

In the synthesizer shown in FIG. 6, since components other than the isolator 36 operate in the same way as in the synthesizer shown in FIG. 4, the S/N enhancer can be formed to be small in size and impedance matching can easily be achieved.

Further, in the synthesizer 11 shown in FIG. 6, since the isolator 36 is connected between the second input terminal 24b and the output-side transducer 22, isolation and directivity between the second input terminal 24b and the output-side transducer 22 are improved.

Figure 7:
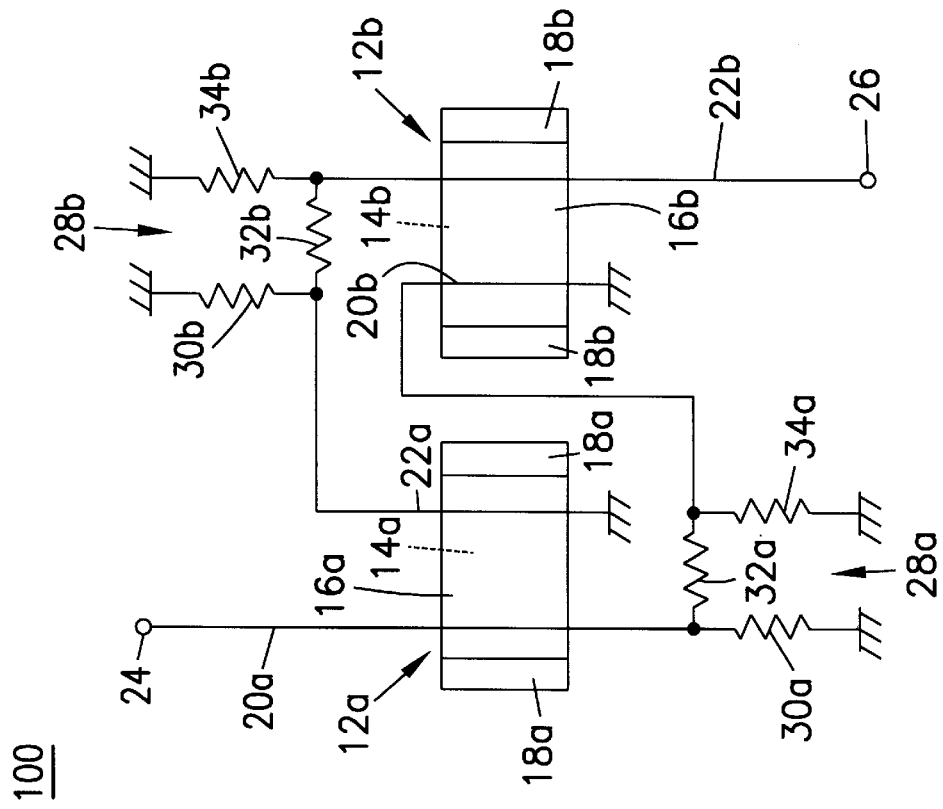
FIG. 7 is a schematic view illustrating an example of an S/N enhancer according to an embodiment of the present invention.

FIG. 7 is a schematic view illustrating an example of an S/N enhancer according to the present invention. An S/N enhancer 100 comprises a first magnetostatic wave element 12a and a second magnetostatic wave element 12b.

The magnetostatic wave element 12a comprises a GGG substrate 14a, for example, in the shape of a strip. A YIG thin film 16a is formed as a first ferromagnetic substrate on one of the main surfaces of the GGG substrate 14a. Magnetostatic wave absorbing materials 18a for absorbing undesired magnetostatic waves which are generated in the YIG thin film 16a are formed respectively extending across both of the end portions of the surface of the YIG thin film 16a.

In a similar manner, the second magnetostatic wave element 12b comprises a GGG substrate 14b, for example, in the shape of a strip. A YIG thin film 16b is formed as a second ferromagnetic substrate on one of the main surfaces of the GGG substrate 14b. Magnetostatic wave absorbing materials 18b for absorbing undesired magnetostatic waves which are generated in the YIG thin film 16b are formed respectively extending across both of the end portions of the surface of the YIG thin film 16b.

A first input-side transducer 20a and a first output-side transducer 22a o which are, for example, in the shape of a single line are disposed in parallel spaced from each other on the YIG thin film 16a of the first magnetostatic wave element 12a. In this case, the first input-side transducer 20a and the first output-side transducer 22a are disposed in such a manner as to cross one end portion and the other end portion of the YIG thin film 16a along the width thereof.

In a similar manner, a second input-side transducer 20b and a second output-side transducer 22b which are, for example, in the shape of a single line are disposed in parallel spaced from each other on the YIG thin film 16b of the second magnetostatic wave element 12b. In this case, the second input-side transducer 20b and the second output-side transducer 22b are disposed in such a manner as to cross one end portion the other end portion of the YIG thin film 16b along the width thereof.

The input terminal 24 is connected to one end of the first input-side transducer 20a. A first attenuator 28a is connected between the other end of the first input-side transducer 20a and one end of the second input-side transducer 20b. The first attenuator 28a is formed of three resistors 30a, 32a and 34a which are connected, for example, in the shape of π.

A 180° shifter 38 and a second attenuator 28b are connected in series between one end of the first output-side transducer 22a and one end of the second output-side transducer 22b. As the 180° shifter 38, for example, a phase inversion circuit is used. The second attenuator 28b is formed of three resistors 30b, 32b and 34b which are connected, for example, in the shape of π.

The output terminal 26 is connected to the other end of the second output-side transducer 22b. The other end of the first output-side transducer 22a and the other end of the second output-side transducer 22b are respectively grounded.

A DC magnetic-field is applied to the YIG thin film 16a in parallel to a direction in which the first input-side transducer 20a and the first output-side transducer 22a extend, and a DC magnetic-field is applied to the YIG thin film 16b in parallel to a direction in which the second input-side transducer 20b and the second output-side transducer 22b extend.

In the S/N enhancer 100, when a signal containing a main signal is input to the input terminal 24, the input signal passes through the first input-side transducer 20a and is attenuated by the first attenuator 28a, and then is input to the second input-side transducer 20b. The main signal in the input signal is converted into a surface magnetostatic wave, which is propagated from the second input-side transducer 20b to the second output-side transducer 22b. Then, the magnetostatic wave is converted into a main signal by the second output-side transducer 22b. In this case, since, after the level of the input signal is attenuated by the first attenuator 28a, the main signal in the input signal is converted into a surface magnetostatic wave and the surface magnetostatic wave is converted into a main signal, the main signal receives hardly any amplitude limitation. The main signal is then output from the output terminal 26.

The main signal in the input signal is converted into a surface magnetostatic wave in the first magnetostatic wave element 12a as well. This surface magnetostatic wave is propagated from the first input-side transducer 20a to the first output-side transducer 22a. The surface magnetostatic wave is then converted into a main signal by the first output-side transducer 22a. In this case, since the main signal in the input signal is converted into a surface magnetostatic wave without attenuating the level of the input signal and the surface magnetostatic wave is converted into a main signal, the main signal receives amplitude limitation. Then, the phase of the main signal is inverted by the 180° shifter 38, and the level thereof is attenuated by the second attenuator 28b. Then, the main signal is output from the output terminal 26 after passing through the second output-side transducer 22b.

Therefore, in the S/N enhancer 100, the value of the main signal level which passes through the first signal path is reduced by the value of the main signal level which passes through the second signal path, and the resultant value of the main signal is obtained at the output terminal 26.

Also, in this S/N enhancer 100, noise which passes through the first attenuator 28a and noise which passes through the first attenuator 28b cancel each other, thus suppressing the noise. Therefore, in the S/N enhancer 100, the S/N ratio of the input signal is improved. Further, since a directional coupler is not used in the S/N enhancer 100, the S/N enhancer 100 can easily be formed to be small in size.

Further, in the S/N enhancer 100, the input terminal and the output terminal are not connected to circuits with branches, the input terminal 24 is connected to one end of the first input-side transducer 20a, and the output terminal 26 is connected to the other end of the second output-side transducer 22b; thus, impedance matching can easily be achieved.

Figure 8:
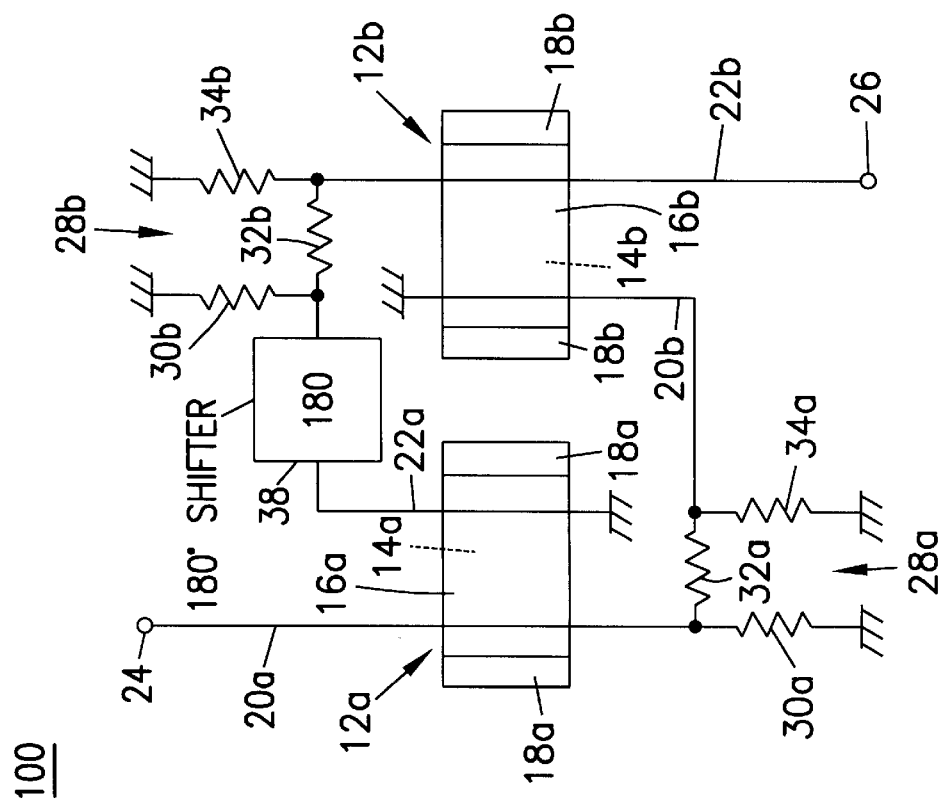
FIG. 8 is a schematic view illustrating another example of an S/N enhancer according to an embodiment of the present invention.
Figure 9:
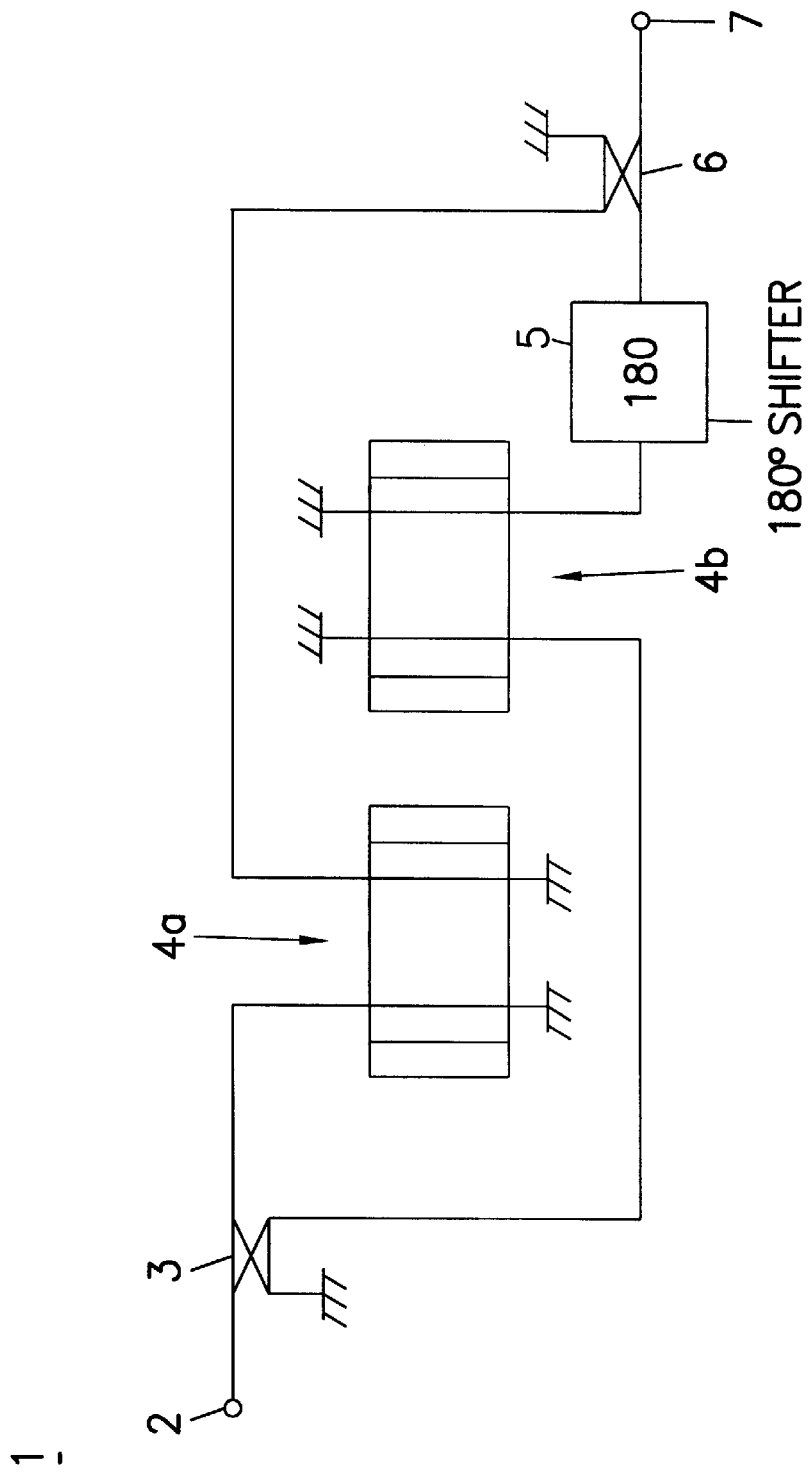
FIG. 9 is a schematic view illustrating an example of a conventional S/N enhancer.
Figure 10:
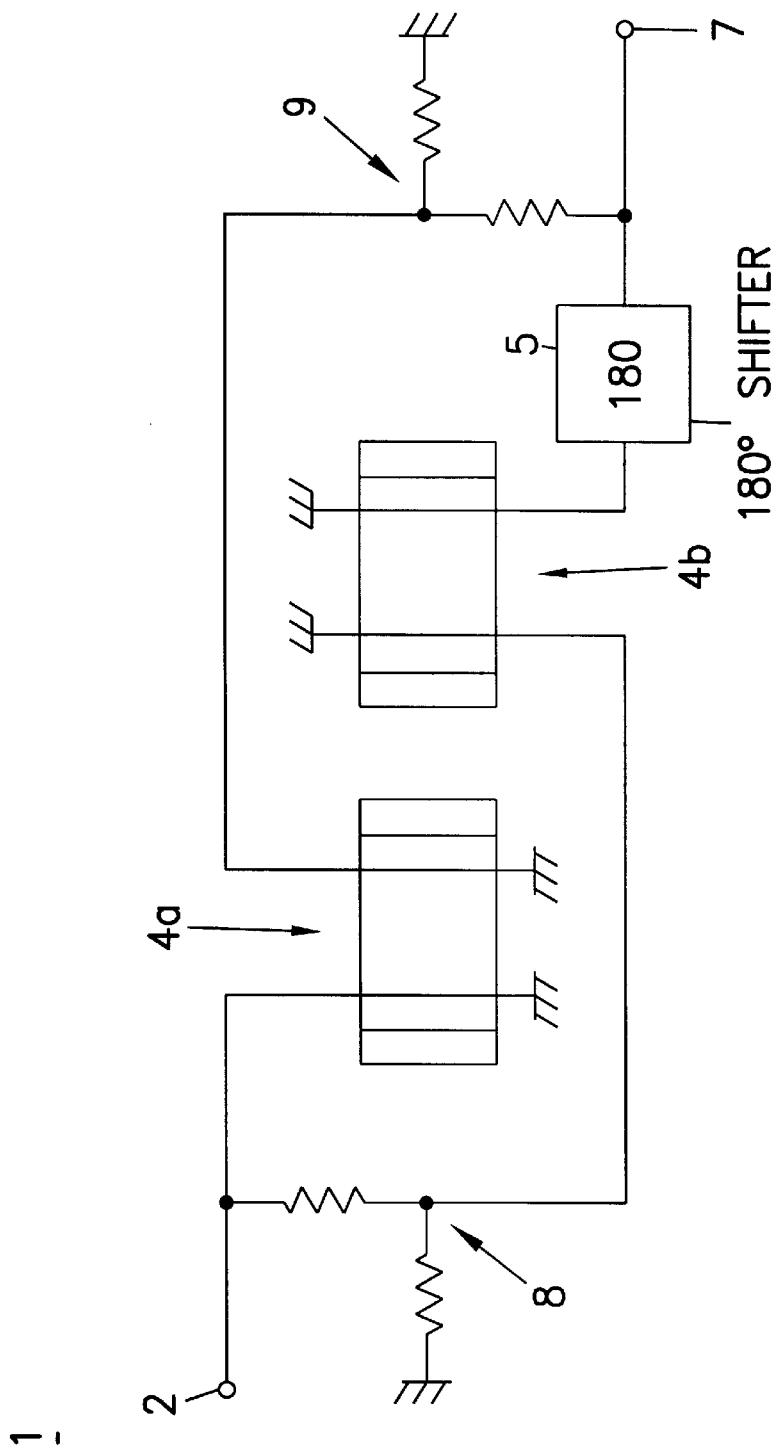
FIG. 10 is a schematic view illustrating another example of a conventional S/N enhancer.

FIG. 8 is a schematic view illustrating another example of an S/N enhancer according to an embodiment of the present invention. In the S/N enhancer shown in FIG. 8, as compared with the S/N enhancer shown in FIG. 7, there is no 180° shifter 38 connected between the first output-side transducer 22a and the second attenuator 28b. Instead, the first output-side transducer 22a and the second attenuator 28b are directly connected to each other, and in the second input-side transducer 20b, the ends opposite to those used in FIG. 7 are used as the input side and the grounding side.

In the S/N enhancer shown in FIG. 8, as compared with the S/N enhancer shown in FIG. 7, the phase of the main signal output from the first output-side transducer 22a is not inverted. On the other hand, the signal from the first attenuator 28a is input to the second input-side transducer 20b from the opposite end. Other than the above, the S/N enhancer shown in FIG. 8 operates in the same way as the S/N enhancer shown in FIG. 7. Therefore, in the S/N enhancer shown in FIG. 8, the S/N ratio of the input signal is improved, the S/N enhancer can be formed to be small in size, and impedance matching can easily be achieved in the same way as in the S/N enhancer shown in FIG. 7.

Further, in the S/N enhancer 100 shown in FIG. 8, the phase difference of noise is adjusted by reversing the arrangement of the two end portions of the second input-side transducer 20b instead of using the 180° shifter; therefore, the S/N enhancer can easily be formed to an even smaller size.

Although in each embodiment shown in FIGS. 2, 5, 7 and 8, an attenuator formed of three resistors which are connected in the shape of π is used, other types of attenuators may be used in the present invention.

Although in each embodiment shown in FIGS. 3 and 6 an isolator is used, a circulator may be used in place of the isolator in the present invention.

Although in the embodiment shown in FIG. 7 a 180° shifter is provided in the stage anterior to the second attenuator 28b, in the present invention, a 180° shifter may be provided in the stage anterior to or posterior to the first attenuator 28a, or in the stage posterior to the second attenuator 28b.

In addition, although in each of the above-described embodiments a transducer in the shape of a single line is used, in the present invention, a transducer in the shape of multiple lines or in other shapes may be used.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the claims. The following claims are to be accorded the broadest interpretation so as to encompass all such modifications and equivalent structures and functions.

What is claimed is:

1. A distributor, comprising:
   a ferromagnetic substrate adapted to have a DC magnetic field applied thereto;
   an input-side transducer having two ends and being disposed on said ferromagnetic substrate;
   an output-side transducer having two ends and being disposed in parallel to said input-side transducer on said ferromagnetic substrate;

an input terminal connected to one end of said input-side transducer;

a first output terminal connected to the other end of said input-side transducer; and a second output terminal connected to one end of said output-side transducer, wherein the other end of said output-side transducer is grounded; and further comprising: an attenuator connected between said input-side transducer and said first output terminal.

2. A distributor according to claim 1, wherein each of said input-side and output-side transducers is in the shape of a single line.

3. A distributor, comprising:

a ferromagnetic substrate adapted to have a DC magnetic field applied thereto;

an input-side transducer having two ends and being disposed on said ferromagnetic substrate;

an output-side transducer having two ends and being disposed in parallel to said input-side transducer on said ferromagnetic substrate;

an input terminal connected to one end of said input-side transducer;

a first output terminal connected to the other end of said input-side transducer; and a second output terminal connected to one end of said output-side transducer, wherein the other end of said output-side transducer is grounded; and further comprising: a nonreciprocal circuit element connected between said input-side transducer and said first output terminal.

4. A distributor according to claim 3, wherein each of said input-side and output-side transducers is in the shape of a single line.

5. A synthesizer, comprising:

a ferromagnetic substrate adapted to have a DC magnetic field applied thereto;

an input-side transducer having two ends and being disposed on said ferromagnetic substrate;

an output-side transducer having two ends and being disposed in parallel to said input-side transducer on said ferromagnetic substrate;

a first input terminal connected to one end of said input-side transducer;

a second input terminal connected to one end of said output-side transducer; and an output terminal connected to the other end of said output-side transducer, wherein the other end of said input-side transducer is grounded; and further comprising: an attenuator connected between said second input terminal and said output-side transducer.

6. A synthesizer according to claim 5, wherein each of said input-side and output-side transducers is in the shape of a single line.

7. An S/N enhancer, comprising:

A) a first ferromagnetic substrate adapted to have a DC magnetic field applied thereto;
a first input-side transducer having two ends and being disposed on said first ferromagnetic substrate;
a first output-side transducer having two ends and being disposed in parallel to said first input-side transducer on said first ferromagnetic substrate;

B) a second ferromagnetic substrate adapted to have a DC magnetic field applied thereto;

a second input-side transducer having two ends and being disposed on said second ferromagnetic substrate;

a second output-side transducer having two ends and being disposed in parallel to said second input-side transducer on said second ferromagnetic substrate;

C) an input terminal connected to one end of said first input-side transducer;

a first attenuator, connected between the other end of said first input-side transducer and one end of said second input-side transducer, for attenuating a signal which passes through said first input-side transducer;

a second attenuator, connected between one end of said first output-side transducer and one end of said second output-side transducer, for attenuating a signal which passes through said first output-side transducer; and an output terminal connected to the other end of said second output-side transducer, wherein the other end of said first output-side transducer is grounded, and the other end of said second input-side transducer is grounded, whereby noise which passes through said first attenuator and noise which passes through said second attenuator have respective phases so as to cancel each other anterior to said output terminal.

8. An S/N enhancer according to claim 7, wherein an end portion connected to said first attenuator of said first input-side transducer, and an end portion connected to said second attenuator of said first output-side transducer, extend from opposite sides of said first ferromagnetic substrate; and an end portion connected to said first attenuator of said second input-side transducer, and an end portion connected to said second attenuator of said second output-side transducer, extend from the same side of said second ferromagnetic substrate.

9. An S/N enhancer according to claim 7, wherein an end portion connected to said first attenuator of said first input-side transducer, and an end portion connected to said second attenuator of said first output-side transducer, extend from opposite sides of said first ferromagnetic substrate; and an end portion connected to said first attenuator of said second input-side transducer, and an end portion connected to said second attenuator of said second output-side transducer, extend from opposite sides of said second ferromagnetic substrate.

10. An S/N enhancer according to claim 7, wherein a phase difference of said noise is adjusted by a 180° shifter, provided for inverting a signal between said first and second ferromagnetic substrates.

11. An S/N enhancer according to claim 8, wherein an end portion connected to said first attenuator of said first input-side transducer, and an end portion connected to said second attenuator of said first output-side transducer, extend from opposite sides of said first ferromagnetic substrate; and an end portion connected to said first attenuator of said second input-side transducer, and an end portion connected to said second attenuator of said second output-side transducer, extend from opposite sides of said second ferromagnetic substrate.

12. An S/N enhancer according to claim 8, wherein said 180° shifter is connected in series with said second attenuator.

13. An S/N enhancer according to claim 12, wherein said 180° shifter is connected between said first output-side transducer and said second attenuator.

14. An S/N enhancer according to claim 12, wherein
an end portion connected to said first attenuator of said first input-side transducer, and an end portion connected to said second attenuator of said first output-side transducer, extend from opposite sides of said first ferromagnetic substrate; and
an end portion connected to said first attenuator of said second input-side transducer, and an end portion connected to said second attenuator of said second output-side transducer, extend from opposite sides of said second ferromagnetic substrate.

15. A synthesizer, comprising:
a ferromagnetic substrate adapted to have a DC magnetic field applied thereto;
an input-side transducer having two ends and being disposed on said ferromagnetic substrate;
an output-side transducer having two ends and being disposed in parallel to said input-side transducer on said ferromagnetic substrate;
a first input terminal connected to one end of said input-side transducer;
a second input terminal connected to one end of said output-side transducer; and
an output terminal connected to the other end of said output-side transducer,
wherein the other end of said input-side transducer is grounded; and further comprising: a nonreciprocal circuit element connected between said second input terminal and said output-side transducer.

16. A synthesizer according to claim 15, wherein each of said input-side and output-side transducers is in the shape of a single line.

17. A S/N enhancer according to claim 7, wherein each of said input-side and output-side transducers is in the shape of a single line.

* * * * *

UNITED STATES PATENT AND TRADEMARK OFFICE
CERTIFICATE OF CORRECTION

PATENT NO. : 5,923,228
DATED : July 13, 1999
INVENTOR(S) : Takekazu Okada et al.

It is certified that error appears in the above-indentified patent and that said Letters Patent is hereby corrected as shown below:

Line [73] is amended as follows:

--[73] Assignees: Murata Manufacturing Co., Ltd., Japan, and Nippon Hoso Kyokai, Japan.--

Signed and Sealed this

Twenty-second Day of August, 2000

Attest:

Q. TODD DICKINSON

*Attesting Officer*   *Director of Patents and Trademarks*

UNITED STATES PATENT AND TRADEMARK OFFICE
CERTIFICATE OF CORRRECTION

PATENT NO. : 5,923,228
DATED : 7/13/99
INVENTOR(S) : Okada et al.

It is certified that error appears in the above-identified patent and that said Letters Patent is hereby corrected as shown below:

On the title page, item [56] insert the following

FOREIGN PATENT OR PUBLISHED FOREIGN PATENT APPLICATION

| | | DOCUMENT NUMBER | | | | | | PUBLICATION DATE | COUNTRY OR PATENT OFFICE | CLASS | SUBCLASS | TRANSLATION | |
|---|---|---|---|---|---|---|---|---|---|---|---|---|---|
| | | | | | | | | | | | | YES | NO |
| | | 1 | 3 | 1 | 8 | 4 | 0 | 2 | 12/22/89 | Japan | | | X | |
| | | 4 | 1 | 2 | 3 | 5 | 0 | 2 | 4/23/92 | Japan | | | | X |
| | | | | | | | | | | | | | | |
| | | | | | | | | | | | | | | |
| | | | | | | | | | | | | | | |

OTHER DOCUMENTS (Including Author, Title, Date, Pertinent Pages, Etc.)

Ishikawa et al., "A Broadcast Signal-to-Noise Enhancer Comprising Two Balanced MSSW Filters and 90°degrees Hybrids," March 10, 1994.

Signed and Sealed this

Fourteenth Day of November, 2000

*Attest:*

Q. TODD DICKINSON

*Attesting Officer*    *Director of Patents and Trademarks*